United States Patent [19]
Datta et al.

[11] Patent Number: 5,567,304
[45] Date of Patent: Oct. 22, 1996

[54] ELIMINATION OF ISLAND FORMATION AND CONTACT RESISTANCE PROBLEMS DURING ELECTROETCHING OF BLANKET OR PATTERNED THIN METALLIC LAYERS ON INSULATING SUBSTRATE

[75] Inventors: Madhav Datta, Yorktown Heights; Lubomyr T. Romankiw, Briarcliff Manor; Ravindra V. Shenoy, Peekskill, all of N.Y.

[73] Assignee: IBM Corporation, Armonk, N.Y.

[21] Appl. No.: 367,550

[22] Filed: Jan. 3, 1995

[51] Int. Cl.$^6$ .............................. B23H 3/02; B23H 7/18; B23H 9/06
[52] U.S. Cl. .......................................... 205/666; 205/667
[58] Field of Search ...................... 204/129.65, 224 M; 205/666, 667

[56] References Cited

U.S. PATENT DOCUMENTS

| | | | |
|---|---|---|---|
| 3,616,349 | 7/1968 | Szupillo | 204/143 |
| 4,135,989 | 1/1979 | Pruett | 204/129.1 |
| 4,629,539 | 12/1986 | Imai | 204/129.65 |
| 4,636,285 | 1/1987 | Tarumoto et al. | 204/129.65 |
| 4,642,168 | 2/1987 | Imai | 204/129.65 |
| 4,729,940 | 3/1988 | Nee et al. | 204/129.65 |
| 5,284,554 | 2/1994 | Datta et al. | 204/129.65 |

OTHER PUBLICATIONS

J. P. Hoare, et al., "Electrochemical Machining," *Scientific American*, Jan. 1974, p. 30.

D. M. Allen, "The Principles and Practice of Photochemical Machining and Photoetching", various pages (no date).

R. C. Alkire et al., "Effect of Fluid Flow on Removal of Dissolution Products from Small Cavities", *J. Electrochem. Soc.*, Dec. 1994, pp. 2795–2800.

E. Rosset, et al., "Electrochemical disolution of stainless steels in flow channel cells with and without photoresist masks", *J. Applied Electrochemisty*, 20, pp. 69–76, 1990 *no month.

H. K. Kuiken, "Etching: a two-dimensional mathematical approach", *Prot R. Soc. Lond.*, A392, p. 199, 1984 (no month).

C. Vuik, "Numerical Solution of an Etching Problem", *Journal of Computational Physics*, 59, pp. 247–249, 262, 263, 1985 (no month).

J. M. West, "Electrodeposition and Corrosion Process", Dept. of Metallurgy, Univ. of Sheffield, pp. 108–109, 118–119, 132–133 (no date).

DeBarr & Oliver, "Electrochemical Machining", pp. 114–115, 102–107, 154–163, and 166–175 (no date).

Rosset et al. "Electrochemical dissolution of stainless steels in flow channel cells with and without photoresist masks" (1990) pp. 69–75. (no month).

*Primary Examiner*—Arun S. Phasge
*Attorney, Agent, or Firm*—Ratner & Prestia

[57] ABSTRACT

In through-mask electroetching of a metal film on top of an insulating substrate, the shape of the metal film being etched is a function of the mask opening, the spacing between the openings and the thickness of the mask. An analysis of the electric field around the mask and the metal film is used to determine conditions leading to the formation of islands of unetched metal films within the openings. The analysis is then used to design the mask pattern and eliminate these islands. The increase in the ratio of the mask thickness to the opening width for eliminating the islands also lowers the undercutting of the mask. Premature stoppage of the electroetching process arising from the isolation of the sample film from the contact is also addressed. The electrical contact to the sample is made at one end and a nozzle jet of electrolyte is slowly swept from the far end of the sample towards the electrical contact. The nozzle speed is matched with the metal removal rate and the electrical contact is exposed to the electrolyte at the end of the process.

22 Claims, 8 Drawing Sheets

ELIMINATION OF ISLAND FORMATION AND CONTACT RESISTANCE PROBLEMS DURING ELECTROETCHING OF BLANKET OR PATTERNED THIN METALLIC LAYERS ON INSULATING SUBSTRATE

BACKGROUND OF THE INVENTION

1. Field of the Invention

The present invention relates to electroetching of metal foils, films, or layers adhered onto an insulating substrate, particularly where the metal film is thin in comparison to the size of the etched features.

2. Description of the Prior Art

Etching of metal films is a process that is widely used in industry for manufacturing a wide range of products, from novelty items to computer chips. In many etching applications it is desirable to etch through a thin layer of metal laid on an insulating substrate or base layer; one of the more important commercial applications is microelectronics fabrication.

TAB (tape automated bonding) is an example of a microelectronic component, in which a metal foil adhering to a plastic sheet is masked with photoresist and then etched to remove bare metal. The mask material is then removed, leaving a pattern of conductive metal strips or lines on the sheet which act as wires. The sheet is aligned over a chip, and the lines make connection to various places on the chip.

Another example is a DLM (double layer metallurgy) package, in which layers of metal over a substrate are milled flat.

A third example is C4 (controlled collapse chip connection), an advanced chip packaging technique that employs tiny solder balls resting on pads. C4 requires a continuous seed layer for through-mask electrodeposition of the solder alloy. The seed layer is etched in between the solder pads after electrodeposition, leaving the seed layer under the isolated pads.

FIG. 1 illustrates the background art, showing a basic electroetching apparatus in accordance with the prior art. A tank T holds liquid electrolyte E, an aqueous solution of a salt (for example, table salt and water). The anode A and the cathode C are wired to a voltage source such as a battery B. When the apparatus is electrified, metal atoms in the anode A are ionized by the electricity and forced out of the metal into the electrolyte solution, so that the metal dissolves into the water. The rate of dissolution is proportional to the electric current, according to Faraday's law. Depending on the chemistry of the metals and salt, the metal ions from the cathode either plate the cathode, fall out as precipitate, or stay in solution.

Electrochemical machining (ECM) is based on the basic electroetching set-up of FIG. 1. In conventional ECM, the cathode is a shaped tool which is held close to the anode and slowly moved toward it. The anode is the workpiece, which is machined away as it dissolves.

In through-mask electrochemical micromachining, metal removal takes place at the exposed metal surface without any need to move the cathode towards the anode or maintain a close tolerance on the anode-cathode distance.

Referring to FIG. 2, an etched film 20 is shown adhered to a substrate 10. On top of the film 20 is a layer of photoresist 30, applied by photolithography or other conventional means. A contact 40 and contact lead 42 allow the metal layer 20 to be connected to a voltage source such as the battery B of FIG. 1, a power supply, or other conventional device.

The openings in the layer 30 existed before electroetching, but the metal layer 20 was continuous. Because of the etching, the metal film 20 in the openings of the mask has been dissolved away, so that the substrate 10 is seen in the gaps. In a larger region, an island 22 of the metal layer 20 remains behind, surrounded by bare substrate 10. Such islands are a problem in microelectronics fabrication.

The mechanism of island formation is shown in FIG. 3, a magnified portion of cross section 3—3 of FIG. 2 at a time just before the island 22 formed. In FIG. 3 the metal film 20 has been eroded away by electroetching. The bulge effect's characteristic spoon shape is seen in the metal 20 cross section. Due to faster etching near the edge of the mask 30, a moat has formed. The moat has a depth m at its lowest point, as compared to the shallow etched depth d near the center of the opening. As etching progresses, the depth m will increase until it equals the metal film thickness b, and then the island 22 seen in FIG. 2 will form. The metal of the island 22 is isolated from the rest of the film 20, and so no electric current can flow through it, and etching stops over the island 22.

FIG. 3 also depicts the undercutting of the bulge effect. The metal 20 has been eroded back a distance u under the edge of the mask layer 30.

According to the letters of FIG. 3, the etch factor is equal to: undercut/maximum depth etched (u/m); the moat factor is equal to: maximum depth etched/depth etched at center of opening (m/d).

It will be seen that no islands will form if there is only a narrow gap in the mask 30, but undercutting will still occur.

Chemical etching can be used to dissolve the metal, but ECM is preferable because it is faster, less dangerous, and less polluting.

Instead of strong acids, ECM uses an aqueous solution of a salt with some acid or base added. Such a solution does not by itself eat away at the metal film. But solutions of water and salt are electrically conductive, and if electricity is made to flow through the metal film while it is immersed in the solution, then the metal will dissolve into the solution. Metal atoms are ionized by applied voltage and then pulled out of the metal into an electrolyte. Usually, the electrolyte is sprayed or flowed over the surface to be etched to ensure uniform removal of material.

A substrate with layers of photoresist and etched metal is depicted in FIG. 2, labelled "prior art."

As etching progresses, metal is dissolved underneath the edge of the mask so that an undercut is typically formed.

An undercut is accompanied by a "moat," a dished-out region or trough running alongside a resist border. The undercut and the moat combine into a characteristic smooth, spoon-shaped curve, whose cross section is depicted in FIG. 3 (labelled "prior art"). The moat and the undercut together are called a "bulge."

The degree of undercut can be described by the absolute undercut (the width of resist left hanging over the metal edge) or by the "etch factor," defined as the ratio of the undercut to the maximum depth of the etch (u/m in FIG. 3). The moat can likewise be described by its depth or by the "moat factor," the ratio of the etch depth at the lowest point in the moat to the etch depth at the center of the opening (m/d in FIG. 3).

The undercuts and moats of the bulge effect are concerns in electronic fabrication. Manufacturers have tried to lower the undercut etch factor as much as possible to allow finer mask detail and to bring the moat etch factor under 1.0.

The resist and the resist lip (portion of resist extending over the undercut) are removed after the etching step is completed, but the undercut remains as a change in the size and shape of the metal pattern. Metal lines left between etched areas are narrowed. Because the undercut changes the shapes of corners and bends, and because the etch factor can vary from place to place, the undercut cannot be corrected by making allowances in the phototool design. Undercutting limits the breadth of lines and the clearance between etched circles, because if etched areas are set too close the undercuts will meet.

Moats cause a problem which is distinct from the problems caused by the undercut. Moats illustrate the problem of "islands". Islands are isolated areas of metal film surrounded by bare substrate. The moat is etched deeper than the metal at the center of the opening. The result is a metal island surrounded by the insulating substrate along the resist edge. The substrate is a non-conducting material, and the island metal is cut off from the rest of the metal film, so no electric current can flow to it.

Since electrochemical micromachining involves the use of neutral salt solutions and relies on the passage of an external current for metal removal, as soon as an island is formed, the electric current does not flow to the island and the island stops dissolving.

An island 22 is illustrated in FIG. 2, labelled "prior art."

Several mathematical models have been developed by researchers studying the bulge effect. These investigators have studied the chemical and hydrodynamic aspects of the problem, but not the electrical aspects.

For example, chemical engineering professors Richard C. Alkire of the University of Illinois, David B. Reiser of the same institution, and Robert L. Sani of the University of Colorado published a paper in the Journal of the Electrochemical Society concerning dissolution in small cavities (*J. Electrochem. Soc.* 131, 2795 (1984)). They used a computer to study how flowing electrolyte would swirl inside a cavity in a surface, for example, a depression being etched into a metal film over a circular gap in the resist.

Alkire, Reiser, and Sani concentrated their studies on this hydrodynamic aspect of the problem, modelling the fluid eddies and then finding the effect of the flow on the concentration of metal ions in the electrolyte. The ion concentration strongly affects the dissolution rate of the metal, because ionized metal atoms in the film more readily pass into an electrolyte which has a lower ion concentration; the ions are electrically charged and repel one another.

The authors did not consider ohmic resistance effects in their study, as they state in their paper (at the second paragraph in the second column on page 2796). That is, they did not take into account the electrical resistivity of the electrolyte as a bulk material, the current distribution in the electrolyte, or the electric field.

Another mathematical study was undertaken by H. K. Kuiken of the Philips Research Laboratories in the Netherlands, and reported in the journal of the Royal Society (*Proc. R. Soc. Lond. A* 392, 199–225 (1984)). Unlike the three-dimensional model of Alkire, Reiser, and Sani, Kuiken's study was two-dimensional, and so the results apply best to an elongated gully or ravine rather than to a circular hole. Like Alkire, Reiser, and Sani, Kuiken did not consider the electrical aspect of the problem, only diffusion (as they note in the Abstract at page 199).

Kuiken examined the effect of atomic diffusion in the case where the electrolyte is stationary instead of flowing. He generated a series of curves, which showed the characteristic spoon-shaped bulge with moat and undercut. Kuiken's work is summarized by Allen at page 124.

C. Vuik (with the Philips Research Laboratory and University Utrecht, Department of Mathematics, Utrecht, the Netherlands) along with C. Cuvelier (of the Department of Mathematics and Informatics, Delft University of Technology, Delft, the Netherlands) wrote on a numerical solution of the etching problem. Their work was published in the Journal of Computational Physics (*J. Comp. Phys.* 59, 247–63 (1985)). Like Kuiken, they considered diffusion but not electric fields or currents. In applying their equations they assumed that the resist layer was infinitely thin.

These theoretical studies have mathematically described some mechanisms of bulge problem, but have not solved the practical problems caused by it.

Another problem encountered in electroetching of thin metallic films atop insulating substrates is that of "contact resistance." The metal film can be very thin, as thin as a few hundred Angstroms. Such a thin layer has high electrical resistance. The contact resistance effect is an accelerating process because, as the film dissolves and becomes thinner, the contact resistance increases.

Contact resistance is not caused by the bulge effect at the mask edge. Rather, it is caused by the foil itself. When etching a continuous thin film without any mask, no islands would form but contact resistance would still be troublesome. The contact resistance problem is encountered in electroetching blanket as well as patterned films.

When electroetching in practiced with an apparatus similar to that shown in FIG. 1, the workpiece comprising the metal film atop an insulating substrate is immersed in liquid electrolyte E, in a tank T. The current for electroetching flows into the film at one or more contacts, and spreads out through the film. Contact resistance is the electrical resistance of the film, in ohms, as measured between any place on the film surface and the contact. The thinner the film the greater its resistance.

By Ohm's law, the current flowing through a resistive film causes a voltage drop across the film. If the whole area of the film were at the same voltage, then the current would be the same all over the film, and metal atoms would be driven from the metal into the electrolyte at the same rate everywhere. However, contact resistance causes different areas of the film surface to be at different voltages. In electroetching, the rate at which metal dissolves into the electrolyte at any one place on the film surface is proportional to the electric current density at that place, which in turn is a function of the voltage there. The voltage drops with increasing distance from the contact, so the metal will etch faster near the contacts. Eventually, the metal near the contacts is etched completely through before the metal farther away, the contacts are isolated, and there is no way to remove the remaining film of metal.

The converse of electroetching is electroplating, in which metal is added instead of removed. The voltage polarity across the electrodes is the reverse of the etching polarity, and a plating solution is used in place of the etching electrolyte. The converse of the contact resistance problem in plating is referred to as the "terminal effect."

The terminal effect causes a greater thickness of metal to be deposited near the contacts than farther away. As in etching, the voltage is higher near the contacts. The greater current caused by the higher voltage increases the rate of metal deposition near the contacts. Once enough thickness is built up, the terminal effect ceases. However, the uneven thickness is not eliminated, since subsequent plating is evenly distributed.

SUMMARY OF THE INVENTION

A metal film having a surface at least partially covered with an insulating mask is electrochemically micromachined. The insulating mask has a thickness h and a plurality of openings, wherein at least one of the plurality of openings has a width 2L and is spaced a distance 2a apart from another one of said plurality of openings. A numerical relationship among a, h, and L is calculated. The insulating mask on the surface of the metal film is formed according to the calculated numerical relationship. The metal film is then electrochemically micromachined.

DETAILED DESCRIPTION OF THE INVENTION

Figure 1:
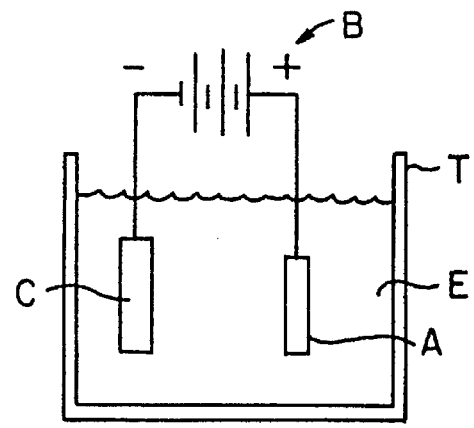
FIG. 1 is a schematic view of an electroetching apparatus and workpiece in accordance with the prior art.

The following definitions apply throughout the specification:

"Breadth" means the spacing between openings, or the distance along the mask in plan, and is designated by 2a;

"bulge effect" means the absolute dimension of an undercut, the absolute moat depth and a depth as measured normally from the original metal surface, the etch factor, the moat factor, or any other measure of the typically spoon-like shape of a metal boundary evolved by etching;

"critical value" means a numerical value of a distance (measured in any units or as a dimensionless ratio) which in conjunction with other quantities introduced as parameters in an electrical analysis leads to the prediction of a specific etch factor value;

"electrochemical micromachining" means electroetching through mask openings;

"etch factor" means a dimensionless ratio of lengths describing the undercut relative to the maximum depth of etching;

"film" means metal having a smooth surface to be electroetched, and includes a layer of metal which is smooth on certain areas and not on other areas as well as a layer of metal unattached to a substrate (such as a foil);

"greatest minimized feature width" or "feature width" means the greatest dimension found in a mask pattern, as measured across an unmasked metal surface from any point along any mask edge to the closest point along a facing mask edge, (put differently, it is the span of a pair of dividers which is set so that if one point is put anywhere along the lines formed by the meeting of the metal and the sidewall, then the other point can be swung without hitting another sidewall);

"maximum acceptable etch factor" means an etch factor cut-off value, below which there will be no impairment of a particular device whose fabrication includes masked electroetching or electrochemical micromachining;

"moat factor" means the ratio of the etch depth at the deepest point in the moat to the etch depth at the center of the opening (this defines moat factors greater than 1.0);

"opening" means a bare area of smooth metal adjacent to mask material, whether enclosed by mask or not;

"pattern" means a two-dimensional plan of masked areas and openings;

"smooth" means having surface irregularities no larger than h or L;

"thickness" means mask thickness h, and not the thickness b of the metal film; and "width" means the distance between openings in plan, and is designated by 2L.

The letters used for dimensions—h, a, L, b, u, m, and d—have a single meaning throughout the specification:

"a" means half the breadth or spacing between openings;

"b" means the metal film thickness that is to be etched through down to the substrate (if the film is not to be etched through, it could refer to the etch depth);

"d" means the minimum etch depth, the depth at the center of the opening, the average etch depth over an opening not counting the moat or other edge irregularities, or a similar measure;

"h" means mask thickness, i.e., the thickness of the masking material as measured from the metal surface to the top surface of the mask—it is the height if the substrate is horizontal (hence the letter h);

"L" means half the width of an opening across a film, as measured between edges of a mask;

"m" means the moat depth; and

"u" means the undercut.

In accordance with an exemplary embodiment of the present invention, resist pattern electroetching is used to remove metal foil in certain regions over a substrate. Patterned photoresist (or some other masking material) is placed onto the foil surface by conventional means, such as photolithography. The masking material should be an electrical insulator, and should not be soluble in water.

One aspect of the present invention relates to the dimensions of the photoresist mask 30 pattern. The dimensions addressed by an exemplary embodiment of the present invention are shown in FIG. 5, while FIG. 4 depicts in perspective view the structure dimensioned in FIG. 5.

Figure 4:
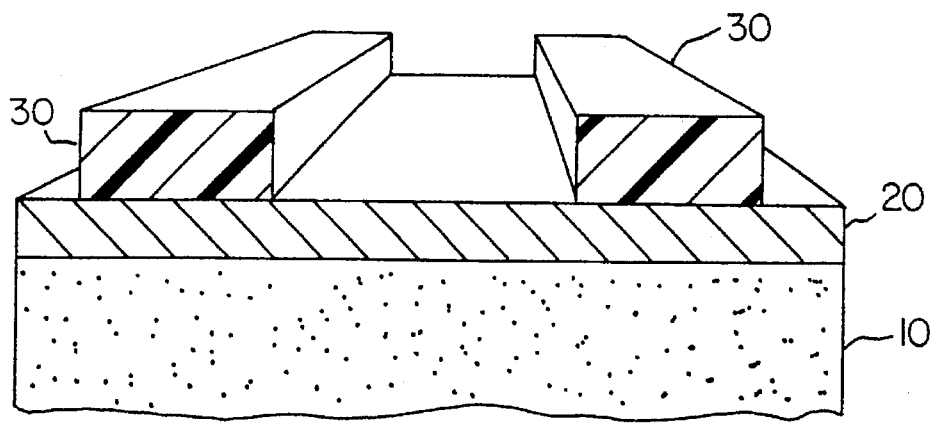
FIG. 4 is a partially cross-sectional and partly perspective view of a substrate, film, and photoresist layer.

FIG. 4 shows the insulating substrate 10 and metal film 20. On the top surface of the film 20, distal the base 10, are strips of photoresist or other insulating mask material 30, laid in parallel rows.

Figure 5:
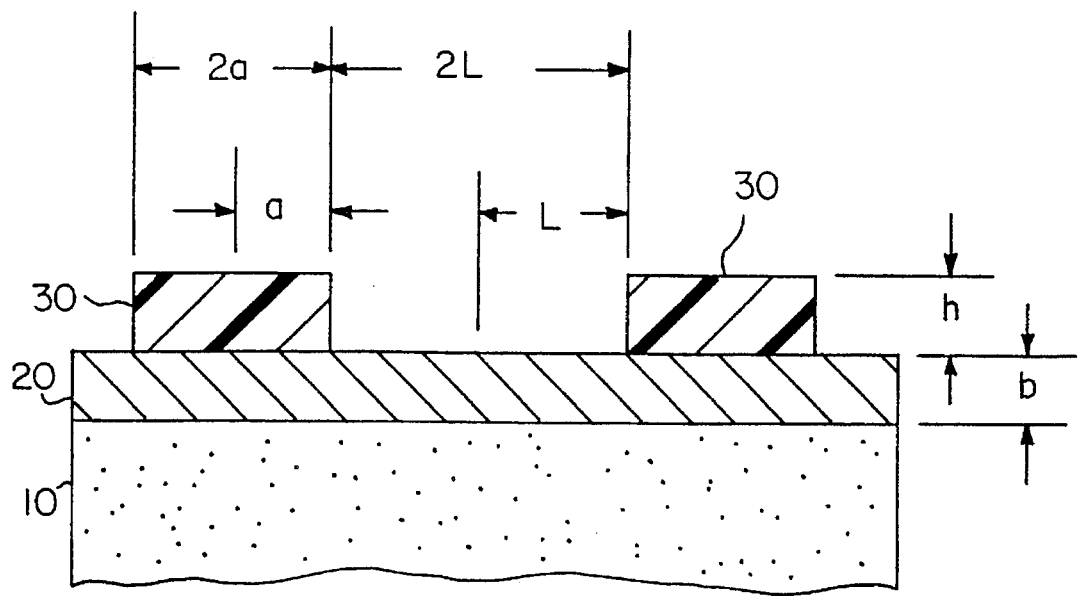
FIG. 5 is a cross-sectional view of the substrate, film, and photoresist layer of FIG. 4 showing dimensional relationships.

The structure of FIG. 5 is a simplified structure. The present invention is not concerned only with parallel resist strips and straight lines. However, the invention is based upon a mathematical analysis, which is simplified by considering a structure such as that of FIGS. 4 and 5.

Referring now to FIG. 5, the layer 20 is of essentially uniform metal thickness b. The strips of photoresist 30 have uniform resist thickness h and breadth 2a. The areas of bare metal in between the photoresist strips, which are to be electroetched down to the substrate, are of width 2L.

Figure 6:
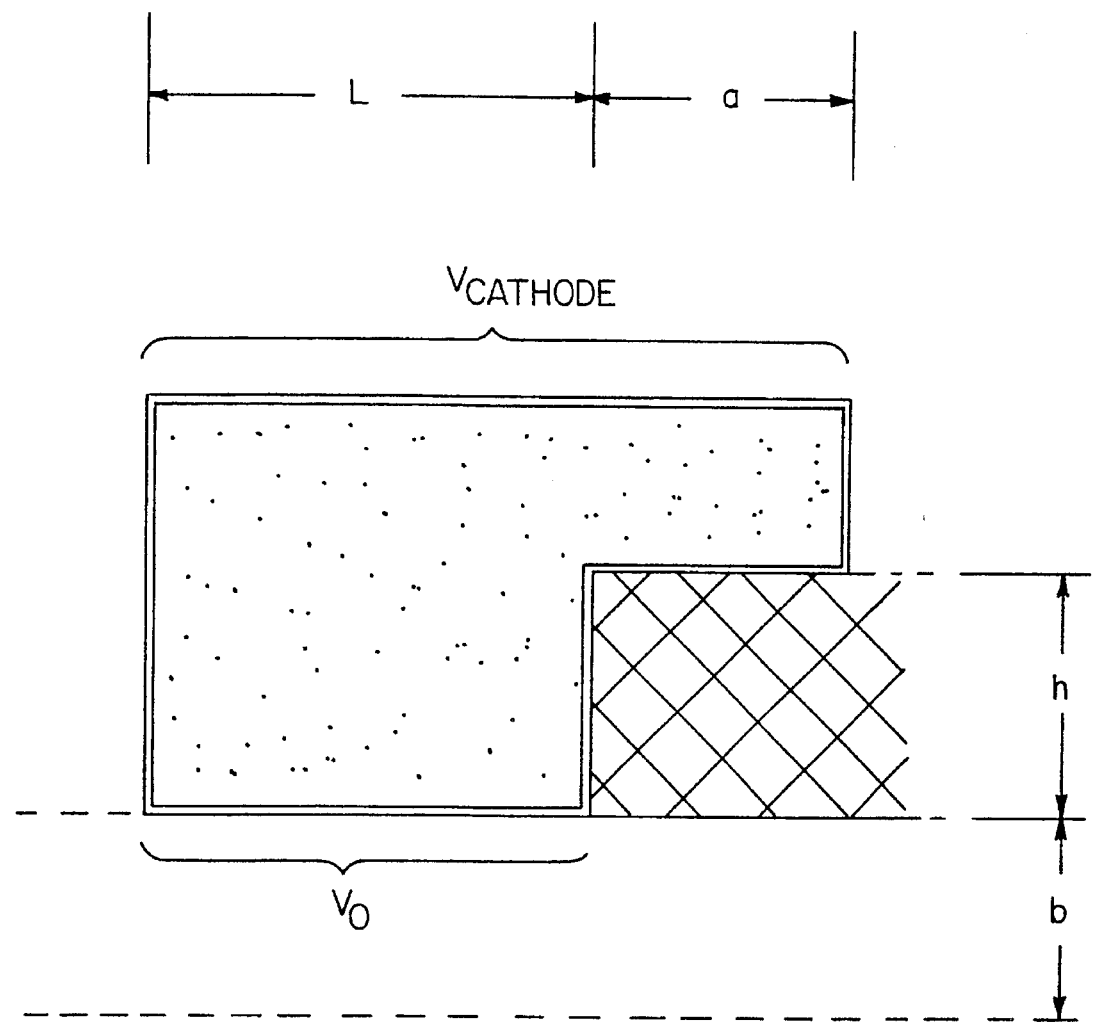
FIG. 6 is a graphical view of the model to which the Laplace equation was applied.

FIG. 6 is the geometrical model which is used to derive aspects of the present invention by mathematical analysis. It depicts a portion of the same structure shown in FIGS. 4 and 5, with the same dimensions a, h, and L as are shown in FIG. 5. Cross-hatching indicates insulating masking material and stippling indicates electrolyte.

Mathematical analysis is much easier if simple and symmetrical shapes are picked. The structure of FIG. 4 is symmetrical when divided down the middle at a distance L and a distance a from one of the mask edges. Also, the cross-sectional shape is the same at all sections. This symmetry means that only the cross section need be mathematically analyzed instead of the whole volume of the trough bordered by the mask 30 strips.

The heavy lines in FIG. 6 are the borders of the analyzed region. Inside this region the Laplace equation, $$\nabla^2 V = 0,$$

is applied and solved to derive an aspect of the present invention. The letter V represents the voltage field in the space occupied by electrolyte, which varies from point to point. The symbol $\nabla^2$ represents a mathematical operation to be performed on the voltage V. The operation $\nabla^2$ examines, for each point of the enclosed region, the rate of change of the voltage variation in each of three perpendicular directions; that is, the second spatial derivative of the voltage.

The Laplace equation can alternatively be applied to the current in the electrolyte, which is a resistive medium. See *Electrochemical Machining*, ed. A. E. De Barr and D. A. Oliver, American Elsevier, New York (1968), at page 167.

Since a cross section is flat, a two-dimensional form of the Laplace equation can be used. By the symmetry discussed above, the solution will apply along the length of the strips shown in FIG. 4.

The two-dimensional form of the Laplace equation is:

$$\frac{d^2V}{dx^2} + \frac{d^2V}{dy^2} = 0$$

where x is the horizontal direction, and y the vertical direction, parallel to the heavy lines of FIG. 6.

The heavy lines in FIG. 6 are the boundaries of the region where the equation is solved. Along the boundaries certain boundary conditions are assumed to hold.

The uppermost line indicates the surface of the cathode, a metal plate. The bracket indicates that the entire surface is at the same potential, or voltage, $V_{cathode}$. This is a very good approximation, since metals conduct electricity well.

The line on the bottom represents the surface of the metal film 20. The bracket indicates that contact resistance is ignored and the potential on this surface is taken to be constant at $V_0 = 0$ volts. The assignment of zero potential is for convenience, and is not to be construed as a limitation on the invention. Any point in the electrolytic cell may be taken as ground.

The corner lines bordering the cross-hatched area represent the edge wall and top surface of the mask layer 30. The condition here is that the variation in potential along a direction normal (perpendicular) to the surface is zero:

$$\frac{\partial V}{\partial n} = 0.$$

That is, the electric field (which is the first derivative of the potential) has no component normal to the mask/electrolyte interface and lines of symmetry.

The reason for this boundary condition is that the electric field and voltage within the electrolyte are related to the currents flowing through the electrolyte. The electrolyte is resistive (a cubic centimeter offers a resistance of about an ohm between two opposing faces). Currents within the electrolyte cause voltage drops according to Ohm's law. Since no current can flow into or out of an insulator, there is no voltage drop in a direction perpendicular to the surfaces of the mask layer 30, which is composed of insulating material.

The left-hand vertical line and the upper-right-hand vertical line represent imaginary planes within the electrolyte half-way between two mask edges. The same boundary condition applies as along the mask 30 edges, but for a different reason. These lines are lines of symmetry: if the equipotential lines crossing them were canted, the electric field would be asymmetrical while the physical structure generating the field were symmetrical.

The Laplace equation may be solved in various ways. Since analytical solution is often difficult, numerical (computer) methods are conventionally used. In this case the boundary element method was used. Each boundary was divided into quadratic elements between equally spaced nodes. The nodes were uniformly spaced along any one boundary (any one heavy line of FIG. 6), but the spacing was allowed to vary from one boundary to the next. The equation was then solved numerically to find the current distribution at the metal surface.

To ensure that the discrete-element method of solution was valid, the problem was repeatedly solved while the number of boundary elements was increased. This was continued until further increases in the fineness of the elements made no change in the solution.

Figure 7:
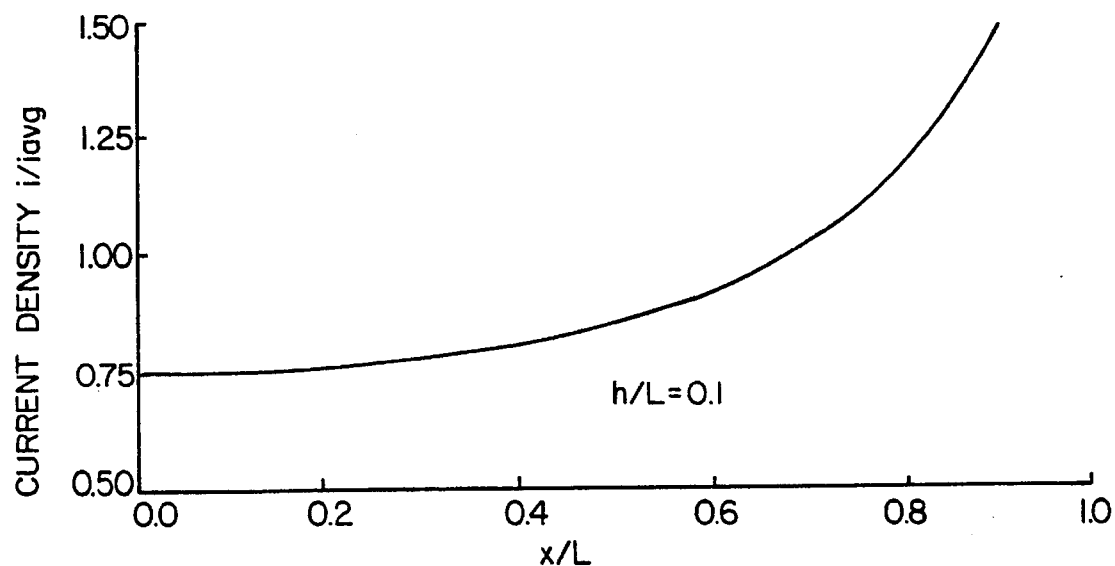
FIG. 7 is a graph showing current density as a function of distance from the mask wall, for a small h/L ratio.

The predicted film surface current distribution for an h/L ratio of 0.1 is graphed in FIG. 7. The current density i is expressed as a fraction of the average current over the whole film surface; this fraction is graphed on the y-axis. The x-location is expressed as a fraction of L, with 0.0 being the center of the opening and 1.0 corresponding to the corner of the film and mask edge wall. The current density is seen to increase rapidly as the mask wall is approached, and go off the graph at the corner.

Having found the current density at the metal surface, the shape assumed by the dissolving film surface can be found.

The extent of electrolytic dissolution depends on the current. Electric current is the flow of electric charges, and each ionized atom that leaves the metal surface carries a fixed charge equal to an integer n times the electron charge. Therefore, the rate of metal removal r at any point on the film surface is proportional to the current density i at that point. The exact relationship is given by Faraday's law, $$r = \frac{M\theta i}{nFp}$$

where M is the molecular weight of the metal, n is the dissolution valence (charge per metal ion), p is the mass density of the metal, F is Faraday's constant and $\theta$ is the dissolution efficiency (assumed here to be 1.0).

Since r is a rate, multiplying it by time gives the depth of metal removed in a unit time. To find out how the metal film 20 surface changes as it dissolves, a moving boundary algorithm was used to change the shape of the lower heavy line in FIG. 6. A time interval delta t was chosen, and the surface line moved into the metal a distance equal to delta t times r to determine the new position of the metal film. The Laplace's equation is then solved again to determine the current distribution at the newly positioned metal surface. The procedure is repeated to generate the shape of metal film as it is etched.

Because the arc length of the metal surface line increases with each step, extra boundary elements were included when needed by adding nodes near the corner. This kept the element size constant, to avoid error. The calculations were again repeated as the interval delta t was decreased until no difference in the generated shape was detectable.

Figure 8:
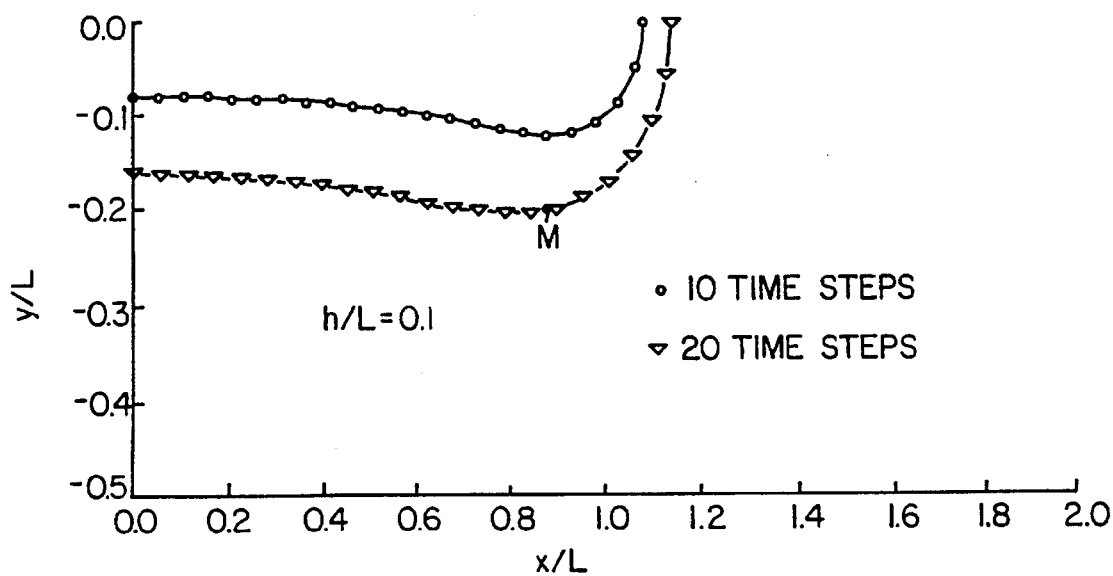
FIG. 8 is a curve predicting an etched surface shape, developed from the current density of FIG. 7.

Predictions of the evolved boundary shape for an h/L ratio of 0.1 are graphed in FIG. 8. The upper line represents the shape after ten time steps, and the lower curve is the shape after twenty steps. The undercut and moat of the bulge effect are clearly visible.

In continued analysis of the same kind it was found that an increase in the ratio of h to L substantially decreased the bulge effect.

Figure 9:
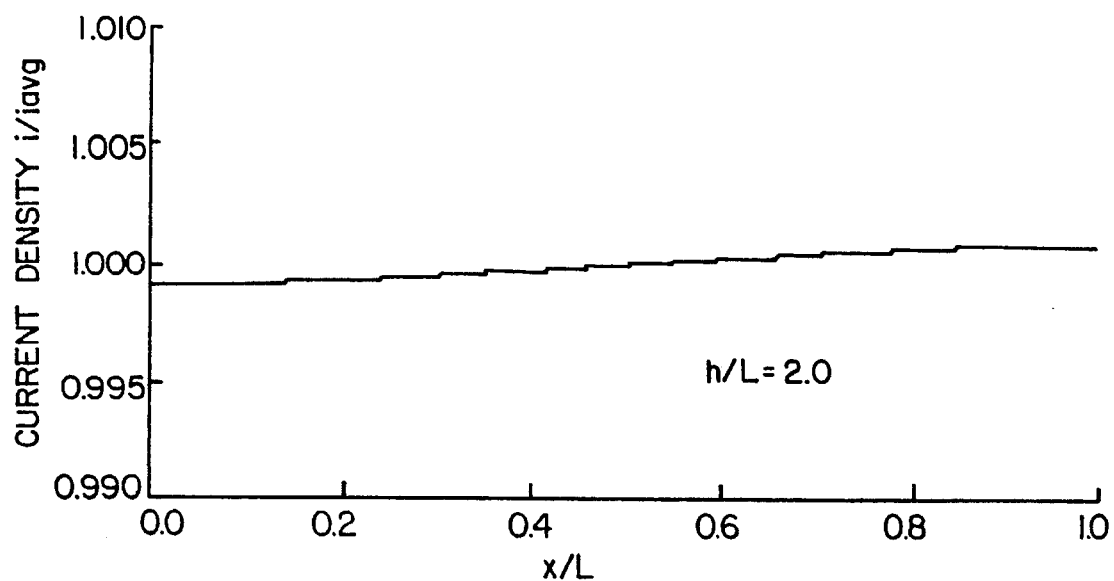
FIG. 9 is a graph showing current density as a function of distance from the mask wall, for a large h/L ratio.

The predicted current distribution for an h/L ratio of 2.0 is graphed in FIG. 9, which is similar to FIG. 7. The x-axis is the same, and the current density i is again expressed as a fraction of the average current, but in FIG. 9 the current scale is much expanded, by 50 times. Despite the large increase in scale, the current line is almost flat. The 20 times increase in mask thickness caused the change in the fraction of average current, from the opening midpoint to 0.2 L from the wall, to decrease by about 500 times.

Figure 10:
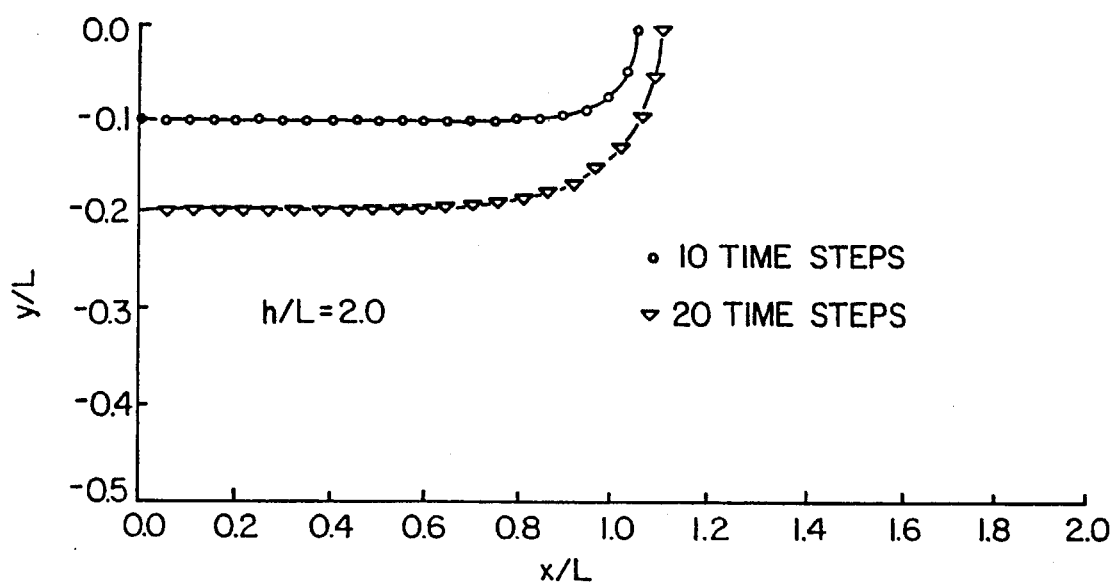
FIG. 10 is a curve predicting an etched surface shape, developed from the current density of FIG. 9.

The predicted evolved boundary shape for an h/L ratio of 2.0 is graphed in FIG. 10. The moat is absent and the moat etch factor is less than 1.0; the deepest part of the opening floor is in the center, at a distance L away from the mask edge.

In FIG. 10 the undercut is about 75% of the undercut shown in FIG. 8.

Besides the height or thickness h of the mask, the width a of the mask can also be varied while the same analysis is applied. It is found that the dimension a has no effect on the evolved boundary shape when a is greater than three times L, but as a/L decreases below that value the bulge effect increases.

The present analysis deals with "primary" current distribution, the gross distribution as controlled by geometry and resistance. "Secondary" current distribution effects on the quantity i, such as kinetic resistance at the electrodes, were ignored. This does not invalidate the model, however, since these limitations would tend to make the current distribution more uniform—the graph of FIG. 10 is a "worst case" which represents the same or a greater degree of bulge than an alternative model which accounted for kinetic limitations.

In sum, the above analyses show that the etch factors are a function of the h/L ratio and the a/L ratio. On this basis, an exemplary embodiment of the present invention contemplates a physical mask structure in which the ratios of h/L and a/L are set to eliminate moats and thereby prevent island formation.

The derivation above is independent of scaling or size. Therefore, the preferred mode of using the invention is to determine h, a, and L as a function of the etch factor, and not as a function of the absolute size of the features.

Figure 11:
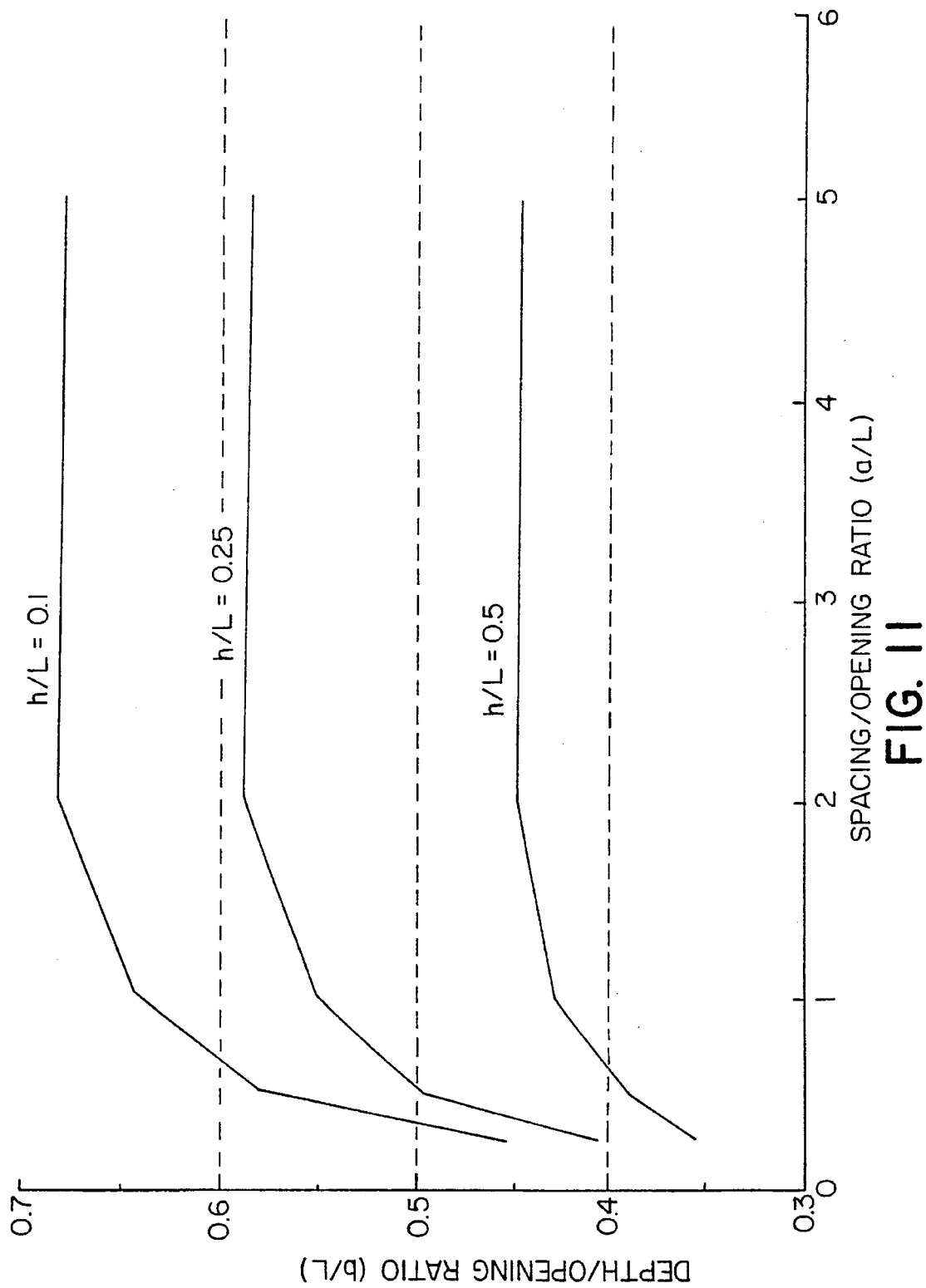
FIG. 11 is a design chart.

An exemplary embodiment of the present invention makes use of the above calculations to design and/or make masks with optimized dimension ratios. In the preferred mode, a design chart such as the chart of FIG. 11 is used.

The evolved boundary shape is calculated for various values of h/L between 0 and 2.5 and a/L between 0.1 and 5. For each case, the evolved boundary shape is calculated using the moving boundary algorithm (see Kuiken, supra) until the greatest etched depth (m) is at the center of the opening shown, for example, in FIG. 8. This value of the greatest etched depth (m) is the critical depth that is required to avoid the problem of island formation for a particular combination of h/L and a/L. If the metal film thickness ratio, b/L is greater than this critical value, islands of unetched metal film are avoided. This information is compiled in the form of a design chart as shown in FIG. 11. Dimension letters in the following discussion of FIG. 11 are best shown in FIGS. 5 and 6. In FIG. 11 the abscissa (horizontal axis) is the spacing to opening ratio (a/L) and the ordinate (vertical axis) is the thickness to opening ratio (b/L), also called the film thickness ratio or aspect ratio. The graph lines represent various mask thickness parameters h/L.

Given a mask pattern (plan), the mask designer may wish to find that mask thickness h (elevation) needed to avoid island formation. The designer consults the chart of FIG. 11 as follows.

First, the designer determines L from the mask plan. Since the analysis involves simplified symmetrical opening shapes, the extension of the analysis to different and asymmetrical shapes is not simple and the dimension L will not be apparent in all cases. In general, L may be taken to be a half-diameter or a half-width, but may be one-half of the greatest minimized feature width of the openings, or some other measure. L may be calculated for the whole mask, solely for certain mask features, for a portion of the mask area, or for one particular feature such as one wide opening.

Second, the designer determines the gap spacing, a, adjacent the place or places in the mask plan where L was determined, and takes the ratio a/L.

Third, the designer notes the metal film thickness b and takes the ratio b/L. Where the film is adhered to a substrate, and is to be etched completely through, the metal film thickness b is the same as the depth to be etched. In other cases, where a film is to be etched only partway through, the value of b is assigned to the etch depth rather than to the film thickness.

Fourth, the designer locates on the chart of FIG. 11 the point corresponding to the particular a/L and b/L found for the mask pattern, called the mask plan point.

Figure 2:
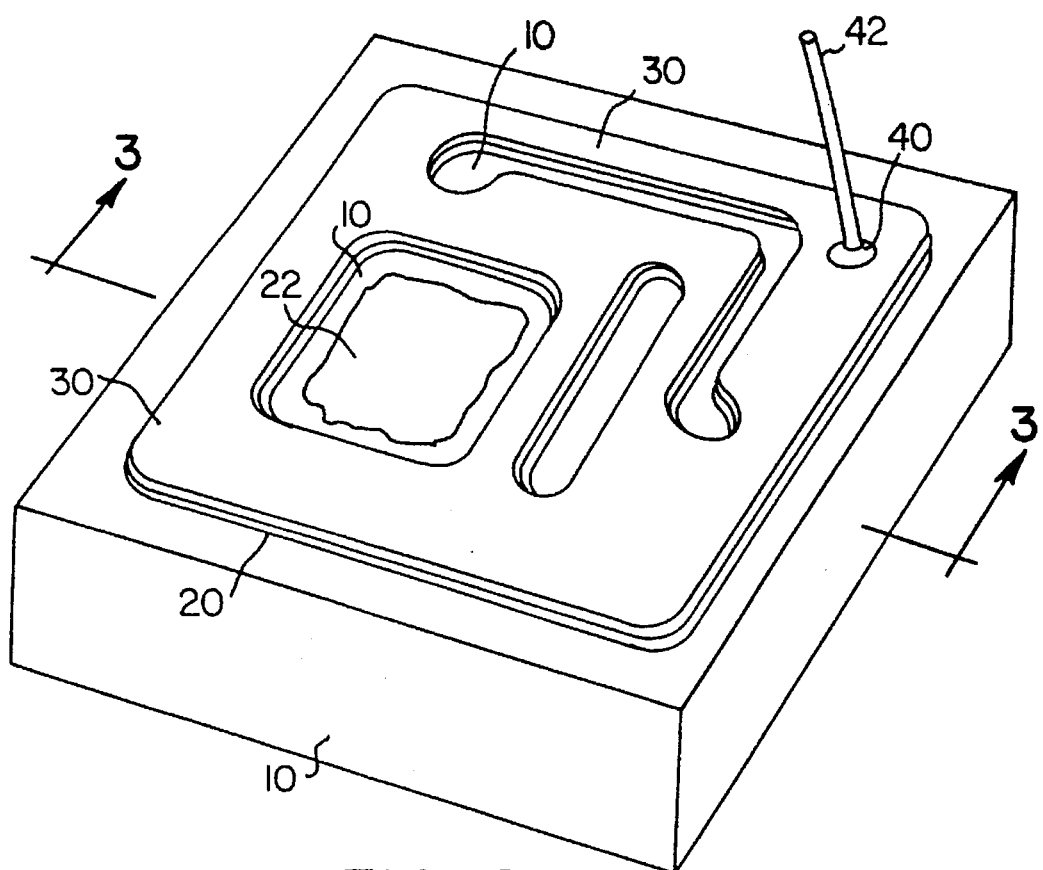
FIG. 2 is a perspective view of an insulating substrate, metal film, and photoresist layer after electroetching in accordance with the prior art.
Figure 3:
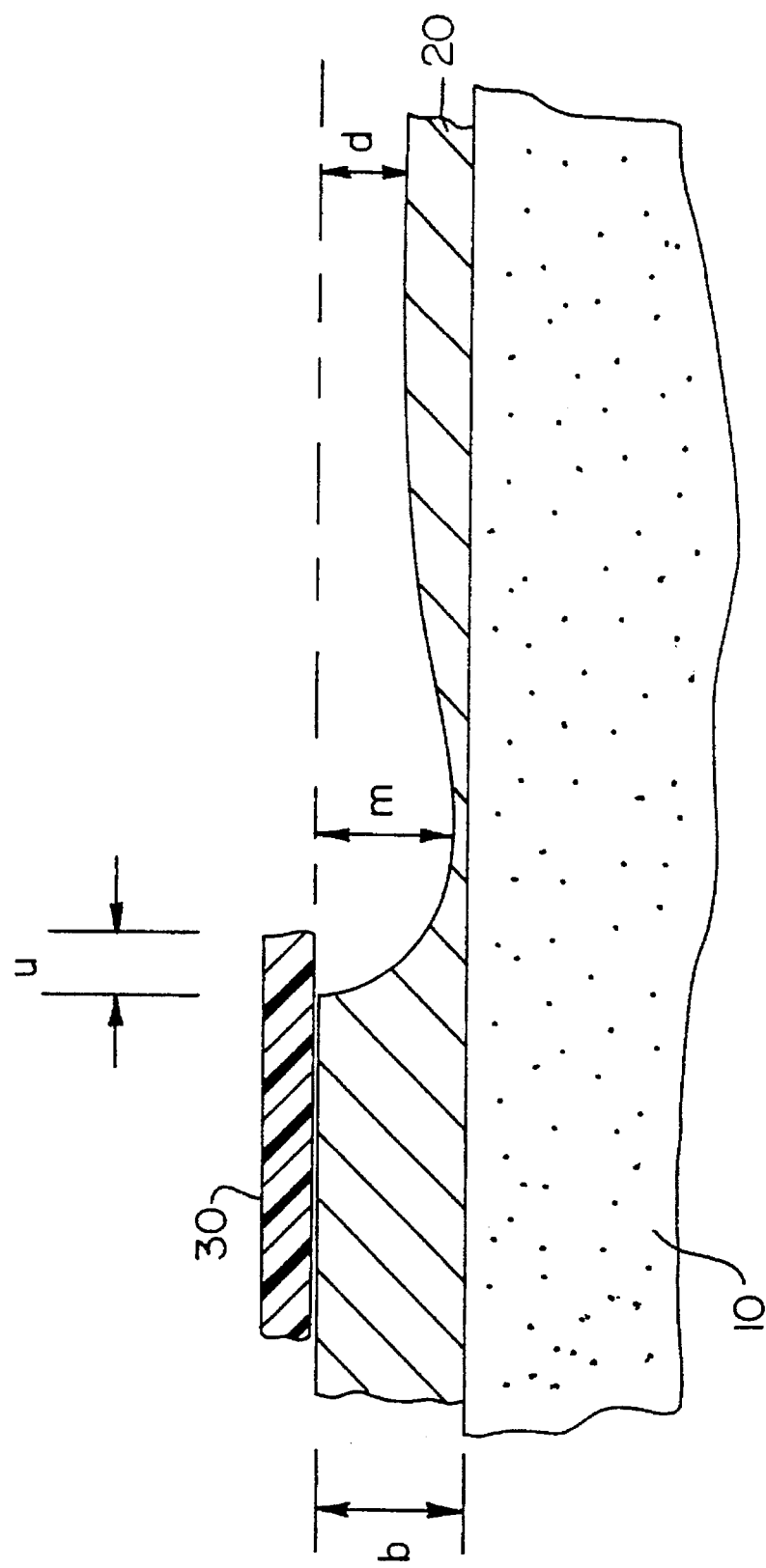
FIG. 3 is a cross-sectional view of a substrate, film, and photoresist layer showing the characteristic shape of the bulge effect in accordance with the prior art.

On the chart of FIG. 11 are three lines of constant h/L ratio, for h/L equal to 0.1, 0.25, and 0.5. The fifth design step is to pick that line of constant h/L ratio which is below the mask plan point, and note the value of h/L for that line. That value of h/L is the critical value for which the greatest etch depth is at the center of the opening, a distance L away from the mask wall. Above the line no moats form, and below the line moats do form, and so also do islands such as the island 22 of FIG. 2.

Finally, the designer figures h from the known value of L and the critical value of the ratio h/L, and specifies that thickness of photoresist for the mask layer 30.

The chart of FIG. 11 could also be used conversely to find a metal film thickness when given a mask thickness h, or in any other way which employs the relationship graphed. More graph lines could be included, whether by calculation, experiment, or interpolation. Interpolation could also be used to find intermediate values between plotted lines. The information could also be re-plotted with different axes, for example with h/L as an axis and plotted lines of constant b/L. Non-graphical but equivalent look-up means such as a table, formula, algorithm, computer program, calculating device, or the like are also within the scope of the invention.

Since the influence of the spacing dimension a is negligible when a is greater than about twice L, an exemplary embodiment of the present invention also includes use of a simplified table (or equivalent look-up means) relating h to b for those mask patterns with wide spacing.

The present invention reduces undercut as well as moat depth, and so allows finer details in the mask pattern. The analysis described above generates information on undercuts as well as moats, so a chart like that of FIG. 11 for finding undercut etch factors could be prepared for analogous use. The present invention thus can also be used to design masks with acceptable undercut etch factor values, or minimum separations between openings that avoid breakthrough of adjacent undercuts.

Because some physical factors are not accounted for in the analysis, modification of the chart of FIG. 11 (or of any equivalent look-up means) to incorporate experimental corrections is within the scope of the invention.

An exemplary embodiment of the present invention, as described above, solves the problem of moats and islands, but may not address the problem of contact resistance. A further exemplary embodiment of the present invention solves this problem by the use of single-pass electroetching with a linear electrolyte jet moved slowly toward the contacts 40. Etching is carried out in one sweep, while matching the nozzle speed with the metal removal rate. The work piece is treated as an integral of small regions and the regions of the film 20 distant from the contacts 40 are removed first, then the regions near the contacts 40 are removed. The contacts are exposed only at the last stage of the etching process.

Figure 12:
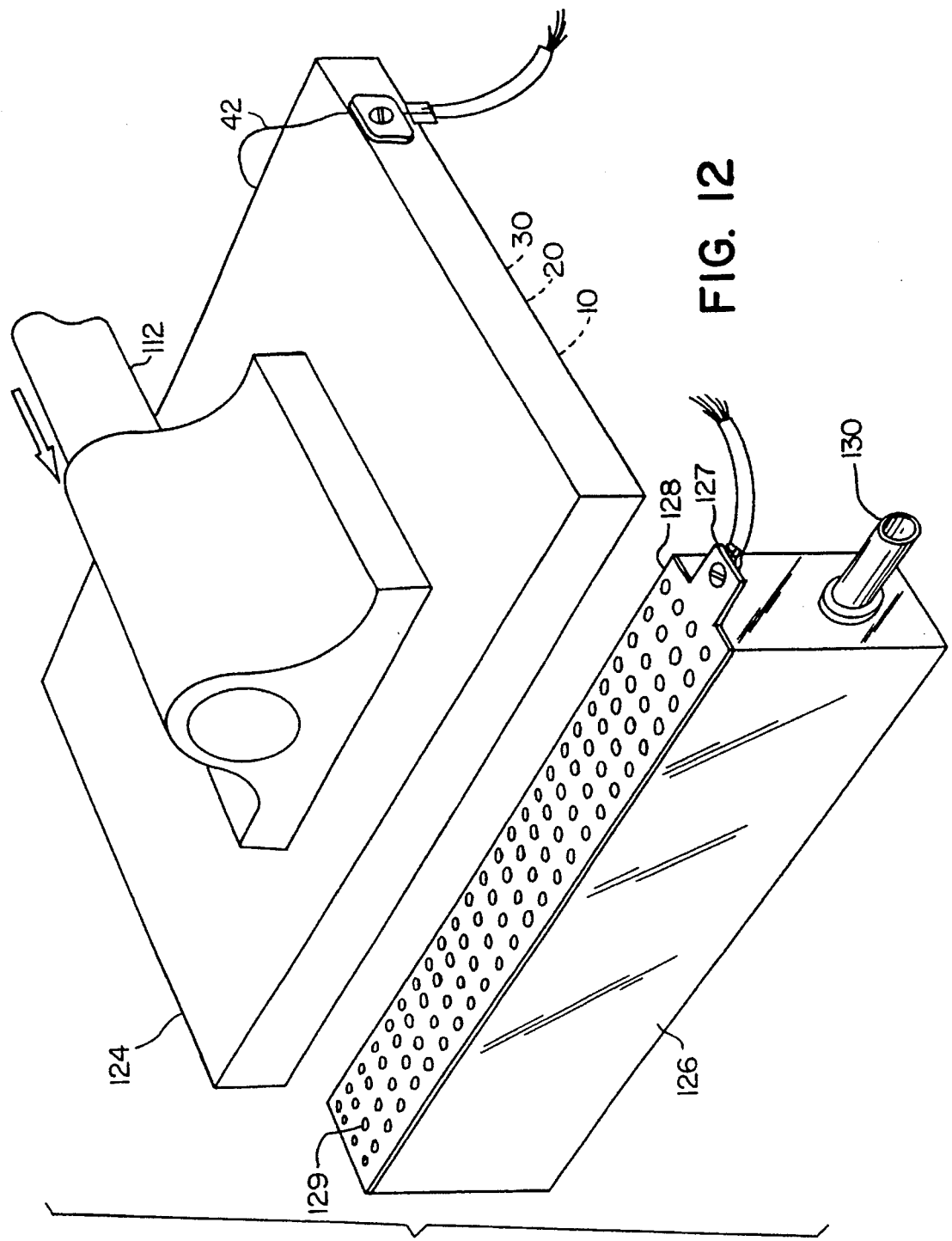
FIG. 12 is perspective view of the multi-nozzle assembly and a film with contacts.

The single-pass etching is carried out by the apparatus of FIG. 12. This apparatus is substantially the same as that disclosed in U.S. Pat. No. 5,284,554, issued to Datta et al. on Feb. 8, 1994 and assigned to International Business Machines Corporation, which patent is incorporated herein by reference. In the present FIG. 12 the drawing numbers are equal to the drawing numbers of the '554 patent plus 100, for the corresponding parts.

In FIG. 12 a nozzle assembly 126 is shown in position below a substrate holder 124. The substrate holder 124 is fixed to a moving stage 112 which moves axially by a conventional mechanism (not shown) to slowly sweep the carrier stage 112 over the nozzle assembly 126 as indicated by the arrow in FIG. 12. The sweep speed is 0.02 to 0.5 cm/s.

A nozzle plate 128 is mounted atop the hollow elongated nozzle assembly 126. The nozzle plate 128 contains many through holes 129. The interior space contained by the walls of the nozzle assembly 126 and the nozzle plate 128 is filled with pressurized electrolyte (not shown) through a fitting 130. The electrolyte spurts out through the plurality of holes 129, creating an elongated jet of electrolyte atop the nozzle plate 128, which is about 2 cm wide and about 15 cm long. The flow rate is 1 to 3 gallons per minute.

The substrate 10, metal film 20, and photoresist 30 are removably attached to the underside of the substrate holder 124. The clearance between the top surface of the nozzle plate 128 and the photoresist layer 30 as the stage 112 sweeps the holder 124 over the nozzle assembly 126 is 2 to 5 mm.

Nozzle plate 128 is of metal and includes a tab 127 for electrical connection to a power supply (not shown). The plate 128 serves as a cathode for electroetching the metal film 20. The contact lead 42 from the contact 40 of the film 20 is electrically connected to the opposite-polarity terminal of the power supply.

The voltage can be applied either as a steady DC (direct current) or as PC (pulsating current).

As the stage 112 sweeps the substrate 10 over the nozzle plate 128, electrolyte completely fills the 2–5 mm interelectrode gap and then falls down over the sides of the nozzle assembly 126. Etching takes place only where the electrolyte impinges, over the nozzle plate 128.

The substrate 10 is oriented on the holder 124 such that the contact or contacts 40 are in the rear, and the sweep rate of the stage 112 is adjusted in conjunction with the voltage and electrolyte flow and formula such that all exposed metal is removed in one pass of the stage 112. The metal near the contacts 40 then cannot be removed before the metal farther away, and contact resistance ceases to be a problem.

The electrolyte, the concentration, the cell voltage, and the voltage pulse width and duty cycle depend on the metal to be etched. If multiple layers are to be etched, the electrolyte chosen should be one which can etch all the metals.

Commonly used electrolytes are 1M to 6M $NaNO_3$, 1M to 5M NaCl, and 0.1M to 0.5M $K_2SO_4$. Glycerol is preferably added to change the viscosity and mass transfer characteristics of the electrolyte. Electrolytes with 1M to 2M glycerol lead to smooth etched surfaces, which is often desirable.

The apparatus of FIG. 12 can also be used for plating, to eliminate the terminal effect. In this application the nozzle assembly 126 is next to the contacts 40 at the start of the sweep. Metal is plated near to the contacts 40 first. The sweep rate of the stage 112, the voltage, and the plating solution flow and formula are adjusted so that metal is deposited in a thickness sufficient to eliminate voltage drop within the metal film once the nozzle assembly 126 has moved to the far end of the substrate 10. Additional metal thickness can then be added in a conventional plating cell.

The invention is not limited to any particular embodiments as discussed above, but includes all within the scope of the following claims.

What is claimed:

1. A method of electrochemically micromachining a metal film having a surface at least partially covered with an insulating mask having a plurality of openings, said method comprising the steps of:

calculating a numerical relationship among a plurality of values including a, h, and L wherein the insulating mask has a thickness h and at least one of said plurality of openings has a width 2L and is spaced a distance 2a apart from another one of said plurality of openings wherein the numerical relationship among a, h, and L is calculated and h is varied to prevent island formation during electrochemical micromachining of the metal film:

forming the insulating mask on the surface of the metal film according to the calculated numerical relationship; and electrochemically micromachining the metal film.

2. A method of electrochemically micromachining a metal film according to claim 1, wherein said electrochemical micromachining is performed in an electrolyte and said numerical relationship is formulated by an analysis of at least one of voltage and current in said electrolyte.

3. A method of electrochemically micromachining a metal film according to claim 2, wherein said analysis of at least one of voltage and current in said electrolyte is performed using the Laplace equation.

4. A method of electrochemical micromachining a metal film according to claim 2, wherein said analysis of at least one of voltage and current in said electrolyte is performed using the boundary element method said method comprising the steps of:

determining three of a plurality of variables including a, b, h, and L where the metal film has a thickness b;

calculating another of a, b, h, and L according to a numerical relationship;

forming the metal film and the insulating mask according to said respective determining and calculating of a, b, h, and L; and electrochemically micromachining the metal film.

5. A method of electrochemically micromachining a metal film according to claim 1, wherein said metal film is connected to a contact prior to electrochemical machining, and wherein said step of electrochemically micromachining the metal film comprises the steps of:

providing an electrolyte;

initiating impingement of said electrolyte onto said metal film at a point on said metal film away from said contact so as to etch said metal film; and continuing impingement of said electrolyte onto said metal film so as to continue etching said metal film from said point on said metal film away from said contact towards said contact in a single sweeping motion to prevent loss of electrical continuity between said contact and said metal film.

6. A method of electrochemically micromachining a metal film according to claim 5, wherein said electrolyte includes a neutral salt solution.

7. A method of electrochemically micromachining a metal film having a surface at least partially covered with an insulating mask having a plurality of openings and said method comprising the steps of:

calculating a numerical relationship along a plurality of values including, a, h and L wherein the insulating mask has a thickness h and at least one of said plurality of openings has a width 2L and is spaced a distance 2a apart from another one of said plurality of openings wherein the numerical relationship among a, h, and L is calculated and h is varied to at least partially prevent undercut of said metal film;

forming the insulating mask on the surface of the metal film according to the calculated numerical relationship; and electrochemically micromachining the metal film.

8. A method of electrochemically micromachining a metal film according to claim 7, wherein said electrochemical micromachining is performed in an electrolyte and said numerical relationship is formulated by an analysis of at least one of voltage and current in said electrolyte.

9. A method of electrochemically micromachining a metal film according to claim 8, wherein said analysis of at least one of voltage and current in said electrolyte is performed using the Laplace equation.

10. A method of electrochemical micromachining a metal film according to claim 8, wherein said analysis of at least one of voltage and current in said electrolyte is performed using the boundary element method, said method comprising the steps of:

determining three of a plurality of variables including a, b, h and L where the metal film has a thickness b:

calculating another of a, b, h, and L according to a numerical relationship;

forming the metal film and tile insulating mask according to said respective determining and calculating of a, b, h, and L; and electrochemically micromachining the metal film.

11. A method of electrochemically micromachining a metal film having a surface at least partially covered with an insulating mask having a plurality of openings, said method comprising the steps of:

determining three of a plurality of variables including a, b, h, and L where the metal film has a thickness b, the insulating mask has a thickness h and at least one of said plurality of openings has a width 2L and is spaced a distance 2a apart from another one of said plurality of openings;

calculating another of a, b, h, and L according to a numerical relationship;

forming the metal film and the insulating mask according to said respective determining and calculating of a, b, h, and L; and electrochemically micromachining the metal film, wherein said another of a, b, h, and L is calculated and one of b and h is varied to prevent island formation during electrochemical micromachining of the metal film.

12. A method of electrochemically micromachining a metal film according to claim 11, wherein said electrochemical micromachining is performed in an electrolyte and said numerical relationship is formulated by an analysis of at least one of voltage and current in said electrolyte.

13. A method of electrochemically micromachining a metal film according to claim 12, wherein said analysis of at least one of voltage and current in said electrolyte is performed using the Laplace equation.

14. A method of electrochemical micromachining a metal film according to claim 12, wherein said analysis of at least one of voltage and current in said electrolyte is performed using the boundary element method.

15. A method of electrochemical micromachining a metal film according to claim 11, wherein another of a, b, h and L is graphically derived to prevent island formation during electrochemical micromachining of the metal film by correlating a, b, h and L.

16. A method of electrochemical micromachining a metal film according to claim 11, wherein another of a, b, h and L is numerically calculated to prevent island formation during electrochemical micromachining of the metal film.

17. A method of electrochemically micromachining a metal film according to claim 11, wherein said metal film is connected to a contact prior to electrochemical machining, and wherein said step of electrochemically micromachining the metal film comprises the steps of:

providing an electrolyte;

initiating impingement of said electrolyte onto said metal film at a point on said metal film away from said contact so as to etch said metal film; and continuing impingement of said electrolyte onto said metal film so as to continue etching said metal film from said point on said metal film away from said contact towards said contact in a single sweeping motion to prevent loss of electrical continuity between said contact and said metal film.

18. A method of electrochemically micromachining a metal film according to claim 17, wherein said electrolyte includes a neutral salt solution.

19. A method of electrochemically micromachining a metal film having a surface at least partially covered with an insulating mask having a plurality of openings, said method comprising the steps of:

determining three of a plurality of variables including a, b, h, and L where the metal film has a thickness b, the insulating mask has a thickness h and at least one of said plurality of openings has a width 2L and is spaced a distance 2a apart from another one of said plurality of openings;

calculating another of a, b, h, and L according to a numerical relationship; wherein said another of a, b, h and L is calculated and one of b and h is varied to prevent undercut of said metal film;

forming the metal film and the insulating mask according to said respective determining and calculating of a, b, h, and L; and electrochemically macromachining the metal film.

20. A method of electrochemically micromachining metal film according to claim 19, wherein said electrochemical micromachining is performed in an electrolyte and said numerical relationship is formulated by an analysis of at least one of voltage and current in said electrolyte.

21. A method of electrochemically micromachining a metal film according to claim 20, wherein said analysis of at least one of voltage and current in said electrolyte is performed using the Laplace equation.

22. A method of electrochemical micromachining a metal film according to claim 20, wherein said analysis of at least one of voltage and current in said electrolyte is performed using the boundary element method.

* * * * *